United States Patent
Ha et al.

(10) Patent No.: US 7,961,456 B2
(45) Date of Patent: Jun. 14, 2011

(54) ORGANIC LIGHT EMITTING DIODE DISPLAY AND METHOD OF MANUFACTURING THE SAME

(75) Inventors: Kuen-Dong Ha, Suwon-si (KR); Dai-Han Cho, Suwon-si (KR); Chan-Kyoung Moon, Suwon-si (KR); Ji-Ho Kang, Suwon-si (KR); Min-Su Kim, Suwon-si (KR); Dong-Su Yee, Suwon-si (KR); Jung-Jun Im, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 100 days.

(21) Appl. No.: 12/320,652

(22) Filed: Jan. 30, 2009

(65) Prior Publication Data
US 2009/0257181 A1    Oct. 15, 2009

(30) Foreign Application Priority Data
Apr. 10, 2008  (KR) ........................ 10-2008-0033111

(51) Int. Cl.
*H05K 5/00* (2006.01)
*H05K 7/00* (2006.01)
(52) U.S. Cl. .............................. 361/679.21; 361/679.26
(58) Field of Classification Search ............. 361/679.21, 361/679.26
See application file for complete search history.

(56) References Cited

U.S. PATENT DOCUMENTS

| 7,292,290 B2 * | 11/2007 | Miyagawa et al. | ............. 349/58 |
| 7,633,746 B2 * | 12/2009 | Ko | ............. 361/679.21 |
| 2005/0243239 A1 | 11/2005 | Kondo et al. | |

FOREIGN PATENT DOCUMENTS

| EP | 1903375 A1 | 3/2008 |
| JP | 05-165013 A | 6/1993 |
| JP | 2004-309699 A | 11/2004 |
| KR | 1020060031510 A | 4/2006 |
| KR | 100722119 B1 | 5/2007 |
| KR | 100729084 B1 | 6/2007 |

OTHER PUBLICATIONS

The extended European Search Report issued by European Patent Office dated Apr. 8, 2009 in Applicant's corresponding European Patent Application No. 09154966.7.
Korean Office Action dated Oct. 31, 2009, corresponding to the Korean Priority Application No. 10-2008-0033111.

* cited by examiner

*Primary Examiner* — Jayprakash N Gandhi
*Assistant Examiner* — Anthony M Haughton
(74) *Attorney, Agent, or Firm* — Robert E. Bushnell, Esq.

(57) ABSTRACT

An organic light emitting diode display that includes a display panel and a bezel to receive the display panel, the bezel including a first bezel and a second bezel, each of the first bezel and the second bezel including different materials and including a bottom portion and a skirt portion protruding from edges of the bottom portion.

20 Claims, 3 Drawing Sheets

ORGANIC LIGHT EMITTING DIODE DISPLAY AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 10 Apr. 2008 and there duly assigned Serial No. 10-2008-0033111.

BACKGROUND OF THE INVENTION

1. Field of the Invention

The present invention relates to an Organic Light Emitting Diode (OLED) display, a module for an OLED display and a method of manufacturing the same.

2. Description of the Related Art

Nowadays, in various display panels that are applied to a display device, due to the fact that semiconductor technology has been rapidly developing, a display panel using an OLED has been in the spotlight. An active matrix OLED display using an organic light emitting element independently controls a pixel by arranging pixels on a substrate in a matrix method. The pixel is the basic unit for representing an image, and each pixel contains a thin film transistor (TFT) and an organic light emitting element.

The organic light emitting element includes a hole injection electrode, an organic emission layer, and an electron injection electrode, and light is emitted by energy that is generated when an exciton that is generated by coupling of electrons and holes falls from an exited state to a ground state within the organic emission layer. Due to such a principle, because the OLED display has self-luminance characteristics, and unlike a Liquid Crystal Display (LCD), does not require a separate light source, a thickness and a weight of the OLED is reduced. Further, because the OLED display has beneficial characteristics such as low power consumption, high luminance, and high reaction speed, the OLED display is appropriate for being used in a mobile electronic device.

In general, the OLED display includes a display panel having two substrates that are fixed together by a sealant, a bezel that is coupled to the display panel, and a printed circuit board that is electrically connected to the display panel through a flexible printed circuit (FPC), thereby forming a module. Unlike an LCD in which a structure such as a backlight unit is positioned between the display panel and the bezel, since the OLED has no structure arranged between the display panel and the bezel, an impact is directly transmitted to the display panel from the bezel when the device is being dropped, allowing the display panel to be easily damaged. Therefore, if the OLED display can be made to withstand impact from dropping, the OLED display can be a superior display device.

SUMMARY OF THE INVENTION

The present invention provides an OLED display and a method of manufacturing the same having advantages of having excellent mechanical strength characteristics.

An exemplary embodiment of the present invention provides an OLED display including a display panel and a bezel arrangement to receive the display panel, the bezel arrangement including a first bezel and a second bezel, each of the first bezel and the second bezel including different materials and including a bottom portion and a skirt portion protruding from edges of the bottom portion. The first bezel and the second bezel can be a single integrated monolithic unit. The first bezel and the second bezel can be of a same shape. The first bezel can have a lower surface hardness and a higher elastic modulus than that of the second bezel. The first bezel can include a resin. The first bezel can be polycarbonate (PC). The second bezel can be a metal. The second bezel can be one of stainless using steel (SUS), steel plate cold commercial (SPCC), aluminum, and a nickel-silver alloy. At least one opening can be arranged in a bottom portion of each of the first bezel and the second bezel. The OLED display can be a portable display device.

According to another aspect of the present invention, there is provided a method of making an OLED display, including mounting a first bezel within a second bezel, the first bezel being of a different material than the second bezel and arranging a display panel within the first bezel.

According to another aspect of the present invention, there is provided a method of making an OLED display, including inserting a first bezel into an injection mold, injecting the second bezel with a material different from that of the first bezel to integrally form the first bezel and the second bezel and arranging the display panel within the second bezel.

BRIEF DESCRIPTION OF THE DRAWINGS

A more complete appreciation of the present invention, and many of the attendant advantages thereof will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
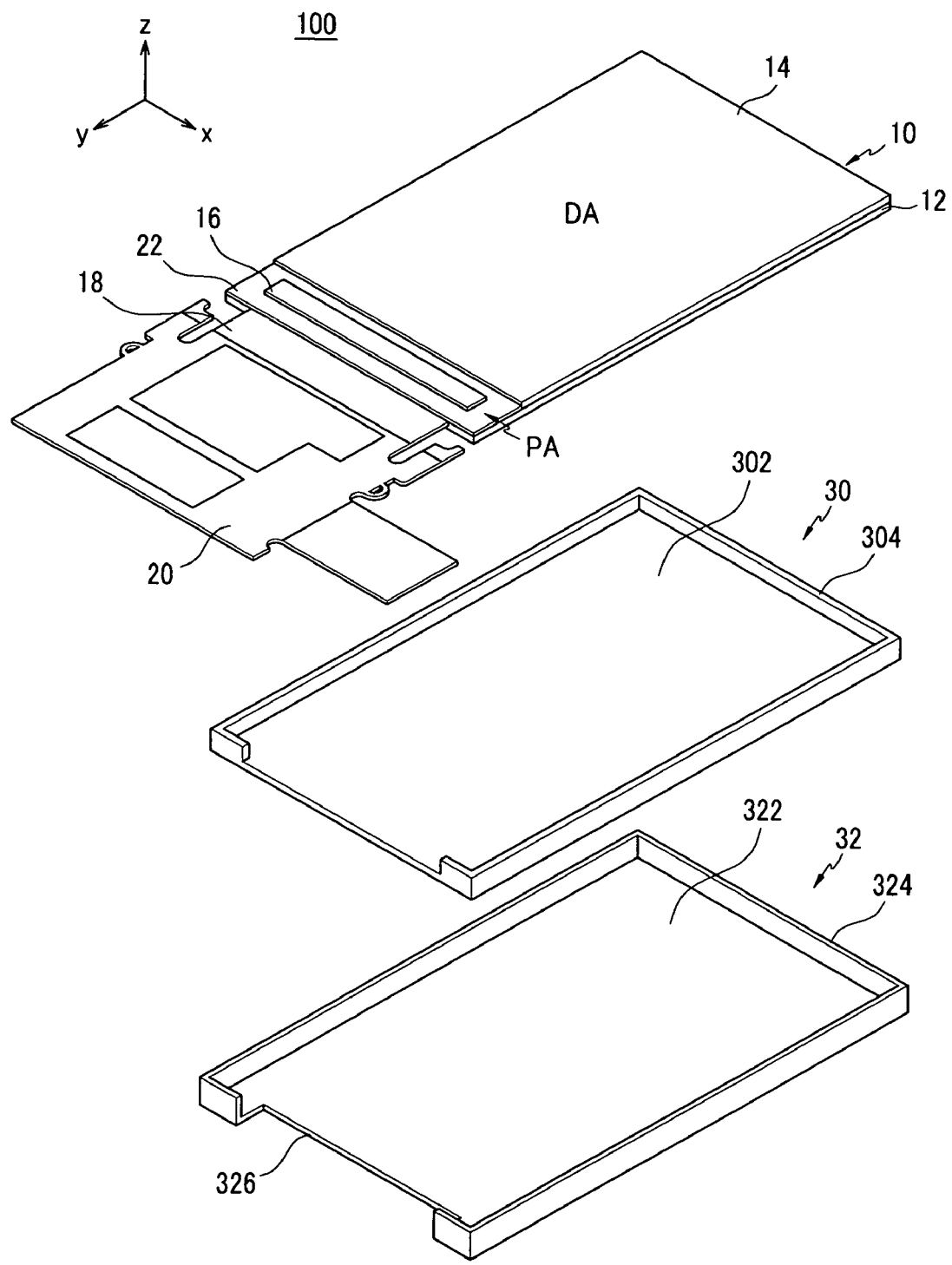
FIG. 1 is an exploded perspective view of an OLED display according a first exemplary embodiment of the present invention.

The present invention is described more fully hereinafter with reference to the accompanying drawings, in which exemplary embodiments of the present invention are shown. As those skilled in the art would realize, the described embodiments can be modified in various different ways, all without departing from the spirit or scope of the present invention. Accordingly, the drawings and description are to be regarded as illustrative in nature and not restrictive. Like reference numerals designate like elements throughout the specification.

To clarify multiple layers and regions, the thicknesses of the layers are enlarged in the drawings. It will be understood that when an element, such as a layer, film, region or substrate is referred to as being "on" another element, it can be directly on the other element or intervening elements can also be present. In contrast, when an element is referred to as being "directly on" another element, there are no intervening elements present. Throughout this specification and the claims that follow, when it is described that an element is "coupled" to another element, the element can be "directly coupled" to the other element or "electrically coupled" to the other element through a third element.

Figure 2:
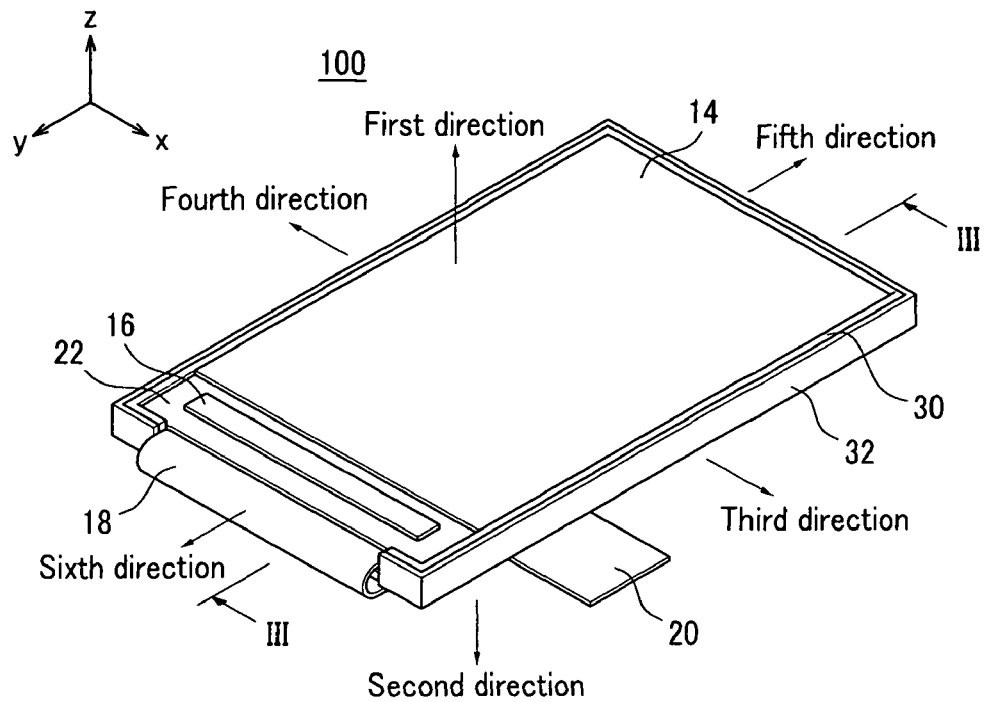
FIG. 2 is a perspective view illustrating a coupled state of the OLED display that is shown in FIG. 1.

Turning now to FIGS. 1 and 2, FIG. 1 is an exploded perspective view illustrating an OLED display 100 according a first an exemplary embodiment of the present invention and FIG. 2 is a perspective view illustrating a state in which a display panel 10 that is shown in FIG. 1 is received in a first bezel 30 and a second bezel 32. Referring to FIGS. 1 and 2, the OLED display 100 includes a display panel 10 that displays an image and the first bezel 30 and the second bezel 32 that receive the display panel 10. The display panel 10 can be for a portable device, such as a cellular phone. However, in an exemplary embodiment of the present invention, the display panel 10 can instead be for a large sized appliance, like a television set.

The display panel 10 includes a first substrate 12, and a second substrate 14 that has a smaller size than the first substrate 12. A display area DA where the image is actually displayed is located where the second substrate 14 overlaps the first substrate 12. For example, when the display device 100 has an active matrix (AM) structure, organic light emitting elements, thin film transistors (TFTs) for driving the organic light emitting elements, and wires that are electrically connected thereto are formed on the first substrate 12 to correspond to the display area DA.

A pad area PA is formed on a portion of the first substrate 12 that is not overlapped by the second substrate 14, and a pad (not shown) that extends from the wires of the display area DA is positioned within the pad area PA. The pads are electrically connected to a printed circuit board (PCB) 20 through a flexible printed circuit (FPC) 18. In the PCB 20, electronic elements (not shown) for processing a driving signal are mounted and a connector (not shown) for transmitting an external signal to the PCB 20 is provided.

An integrated circuit (IC) chip 16 is mounted in the pad area PA of the first substrate 12 to control the display panel 10. The integrated circuit chip 16 generates a plurality of timing signals for applying data driving signals and gate driving signals at an appropriate point of time to the data lines and the gate lines respectively of the display panel 10. A protective layer 22 is formed around the integrated circuit chip 16 to protect the integrated circuit chip 16.

As shown in FIG. 2, in a state where the display panel 10 is received in the first bezel 30 and the second bezel 32, the FPC 18 fixed to the display panel 10 is bent to the rear side of the second bezel 32 so that the PCB 20 is positioned at a rear surface of the second bezel 32.

The OLED display 100 of the first exemplary embodiment includes the first bezel 30 and the second bezel 32. The display panel 10 is arranged within the first bezel 30, and the first bezel 30 is mounted within the second bezel 32. The first bezel 30 includes a first bottom portion 302 corresponding to a size of the display panel 10 and a first skirt portion 304 that is arranged to be perpendicular to the first bottom portion 302 and extend a predetermined height from an edge of the first bottom portion 302. Here, the first skirt portion 304 at the side in which the FPC 18 is arranged is cut out so that the FPC 18 can be positioned thereat without interference.

The first bezel 30 is arranged to be received within the second bezel 32. In this case, the second bezel 32 can have the same shape as that of the first bezel 30 and entirely surround the entire first bezel 30, respectively. That is, the second bezel 32 includes a second bottom portion 322 and a second skirt portion 324 corresponding to the first bottom portion 302 and the first skirt portion 304 of the first bezel 30. As with the first skirt portion 304, the second skirt portion 324 at the side in which the FPC 18 is arranged can be cut out so that the FPC 18 can be positioned thereat without interference. In a side in which a part of the second skirt portion 324 is cut out, a part of the second bottom portion 322 is also cut out to form a groove portion 326 where the part of the second bottom portion 322 is recessed. Through the groove portion 326, a part of the first bezel 30 is exposed by the second bottom portion 322.

Should the first bezel 30 be separated from the second bezel 32 due to a failure that occurs in a process of assembling the first bezel 30 and the second bezel 32, force from the outside can be applied to the portion of the first bezel 30 that is exposed through the groove portion 326 of the second bezel 32 so that the first bezel 30 can be easily separated from the second bezel 32.

When the first bezel 30 and the second bezel 32 are formed to have the above-described structure, a method of manufacturing the first bezel 30 and the second bezel 32 is as follows. First, the first bezel 30 and the second bezel 32 can be individually manufactured. In this case, the first bezel 30 can be manufactured so that the first bezel 30 can be mounted within the second bezel 32. For example, it is preferable that the first bezel 30 be completely inserted into the second bezel 32, and after the first bezel 30 is mounted within the second bezel 32, the first bezel 30 is manufactured to have a size so that it is not easily separated from the second bezel 32. When assembly of the first bezel 30 and the second bezel 32 is completed, the display panel 10 is fitted within the first bezel 30.

The first bezel 30 and the second bezel 32 can be integrally formed. In order to integrally form the first and second bezels 30 and 32, the second bezel 32 is inserted within an injection mold, and the first bezel 30 is injected so that it is formed within the second bezel 32. Injection molding can be easily understood by those skilled in the art and therefore a detailed description thereof is omitted.

When the first bezel 30 and the second bezel 32 are manufactured via injection molding, because both the first bezel 30 and the second bezel 32 can be simultaneously formed, an assembly process of the first bezel 30 and the second bezel 32 can be omitted. Further, because the first bezel 30 and the second bezel 32 are integrally formed, there is an advantage that the first bezel 30 can not be separated from the second bezel 32.

The first bezel 30 and the second bezel 32 can have different strengths. Because the first bezel 30 contacts the rear surface 121 of the display panel 10 whose substrate is generally made out of glass, the first bezel 30 preferably has a relatively low strength so that the display panel 10 is not easily broken by impact.

Therefore, the first bezel 30 can be made out of a resin. For example, the first bezel 30 can be made out of an engineering plastic, particularly polycarbonate (PC). Because engineering plastics have excellent heat resistance, mechanical strength, wear resistance, and insulation, engineering plastics are widely used as a mechanical part of an electronic device. PC has high mechanical strength (bending strength), excellent heat resistance, electric insulation, and a most excellent impact strength among thermoplastic resins. Further, PC has very stable physical characteristics, even with an environmental change, such as a change of humidity and temperature.

PC has a tension strength of 650 kg/cm$^2$, a bending strength of 900 kg/cm$^2$, an elastic modulus of 2800 MPa, and a density of $1.2 \times 10^{-9}$ Ton/mm$^3$. Here, PC is about 1/100 times greater in an elastic modulus than stainless steel (SUS) (206000 MPa) and about ½ times greater in density than a glass substrate ($2.5 \times 10^{-9}$ Ton/mm$^3$) used in a display panel.

Therefore, because surface hardness of PC is much lower than that of metal or glass, when the panel 10 and the first bezel 30 collide upon external impact, the first bezel 30 can sufficiently protect the display panel 10. Further, because PC is 100 times greater in an elastic modulus than SUS, PC can be stable during bending while absorbing an external impact, compared to when the display panel 10 is received in an SUS bezel.

Because the second bezel 32 receives and supports both the display panel 10 and the first bezel 30, and because the second bezel 32 forms an outer side of the OLED display 100, the second bezel 32 can be made out of a material having a relatively high strength in order to sufficiently protect the display panel 10. For example, the second bezel 32 can be made out of a metal material such as SUS, Cold Rolled Carbon Steel Sheets and Strip (SPCC), aluminum, or a nickel-silver alloy having predetermined strength, however the material for the second bezel 32 is not limited to the above-described materials.

As in the first exemplary embodiment, when the first bezel 30, that is made out of a resin material, and the second bezel 32, that is made out of a metal material, are used together, by advancing strength through the second bezel 32 while effectively protecting the display panel 10 from an external impact through a shock-absorbing effect of the first bezel 30, when a falling or a static load is applied to the OLED display 100, the display panel 10 can be prevented from being damaged.

Figure 3:
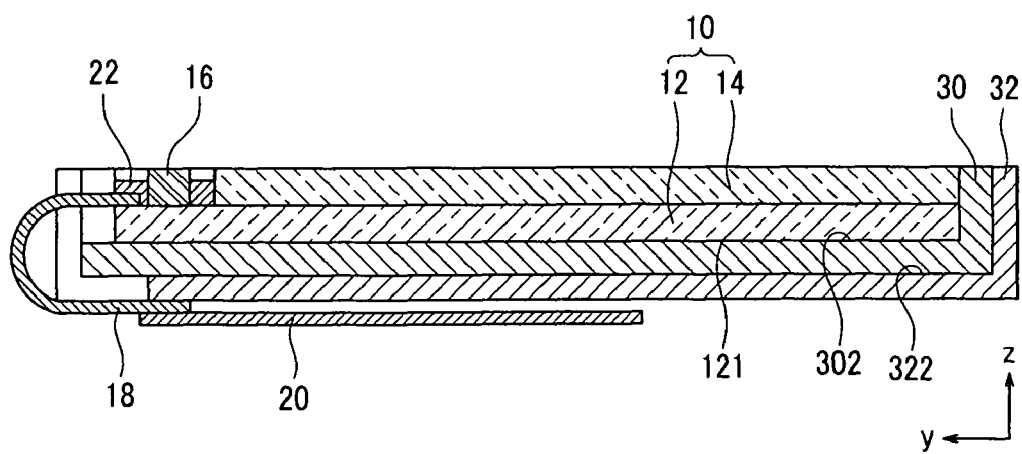
FIG. 3 is a cross-sectional view of the OLED display taken along line III-III of FIG. 2.

FIG. 3 is a cross-sectional view of the OLED display taken along line III-III of FIG. 2. Referring to FIG. 3, the display panel 10 is received within the first bezel 30, and the second bezel 32 supports the display panel 10 and the first bezel 30 while surrounding the first bezel 30. The first bezel 30 is inserted between the display panel 10 and the second bezel 32, and a rear surface 121 of the display panel 10 and the first bottom portion 302 of the first bezel 30 contact each other. In this case, the first bezel 30 can perform a shock-absorbing function for the display panel 10, and the second bezel 32 performs a function of supporting the display panel 10, so that the mechanical strength of the OLED display 100 can be reinforced.

Moreover, in order to absorb an external impact, the OLED display 100 of the first exemplary embodiment can further include a shock-absorbing tape (not shown), such as a poron tape between the display panel 10 and the first bottom portion 302 of the first bezel 30. The OLED display 100 that is formed in this way is provided within a case of a product (such as a cellular phone) to display an image that is requested by the user.

Figure 4:
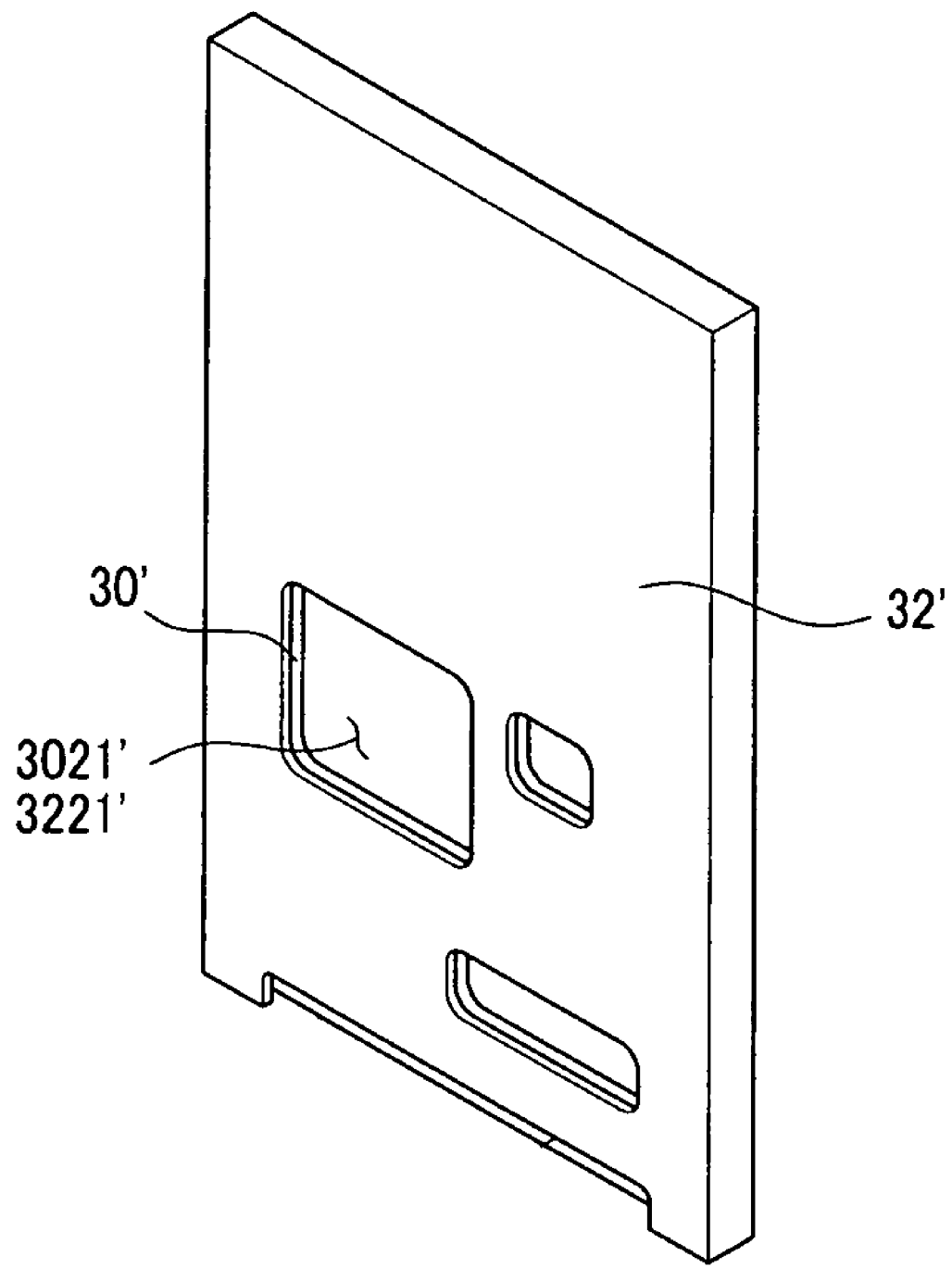
FIG. 4 is a perspective view of a bezel according to a second exemplary embodiment of the present invention.

Turning now to FIG. 4, FIG. 4 is a perspective view illustrating a bezel portion only of an OLED display according to a second exemplary embodiment of the present invention. Like the bezel that is shown in FIG. 1, this bezel includes a plurality of bezels, i.e., a third bezel 30' and a fourth bezel 32'. The third bezel 30' and the fourth bezel 32' can be individually manufactured and assembled or integrally formed together via injection molding, as with the first bezel 30 and the second bezel 32 of the first embodiment.

Further, as with the first bezel 30 and the second bezel 32 of the first embodiment, the third bezel 30' and the fourth bezel 32' of the second embodiment can include a bottom portion and a skirt portion having a shape similar to that of the first bezel 30 and the second bezel 32 of the first embodiment, and a material thereof can be the same as that of the first bezel 30 and the second bezel 32 of the first embodiment.

The third bezel 30' and the fourth bezel 32' have a plurality of third openings 3021' and fourth openings 3221', respectively in a bottom portion thereof. The third openings 3021' are positioned apart from each other, and the fourth openings 3221' are positioned to correspond to the third openings 3021'. Because the third bezel 30' and the fourth bezel 32' have a predetermined thickness, when the third bezel 30' and the fourth bezel 32' are coupled, the third opening 3021' and the fourth opening 3221' have some degree of thickness.

When the OLED display 100 is used in a portable product, in order to decrease a thickness of the product, it is difficult to provide a separate space for electronic elements. Particularly, when mounting electronic elements on an entire surface of the PCB, because the electronic elements reach a bottom portion of the bezel, the electronic elements can be damaged or short-circuited by impact. As a result, the electronic elements can be protected by being arranged within the third opening 3021' and the fourth opening 3221'. As shown in FIG. 2, as the FPC 18 is bent, the PCB 20 reaches a bottom portion of the second bezel 32, and electronic elements (not shown) that are mounted on the PCB 20 can be received in the third opening 3021' and the fourth opening 3221'.

As described above, the OLED display 100 according to the exemplary embodiments of the present invention can reinforce mechanical strength thereof by including the first bezel 30 and the second bezel 32. Empirical results of this mechanical strength will now be described. An inventor of the present invention performed a drop test to determine whether the display panel 10 is damaged by mounting the OLED display 100 of the above-described exemplary embodiment and an OLED display of an Comparative Example in which both a first bezel and a second bezel are made out of metal in a separate drop jig (not shown) and dropping the drop jig.

A drop height of the drop jig was 1.8 m, and a drop direction thereof was as shown by the six arrow directions (a first direction to a sixth direction) corresponding to each side in FIG. 2. By dropping the drop jig three times in each direction, it was determined whether the display panel was damaged. In the drop test, by calculating a good result as 1 point and a failure result as 0 points drop points of the total 18 drop tests (6 directions×3 times) were calculated. Table 1 shows an average drop point and a good result rate after 18 drop tests for OLED displays of an exemplary embodiment and a Comparative Example. In Table 1 below, a good result rate indicates a passing rate when passing all 18 drop tests (or 3 cycle tests).

TABLE 1

|  | The quantity of samples | Average drop point | Passing rate (%) |
|---|---|---|---|
| Exemplary embodiment | 5 | 14.4 | 20 |
| Comparative Example | 5 | 5.2 | 0 |

Referring to Table 1, the Comparative Example shows an average drop point of 5.2 and a passing rate of 0%, whereas an exemplary embodiment shows an average drop point of 14.4 and a passing rate of 20%. It can be seen that the exemplary embodiment has far better characteristics than that of the Comparative Example.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:

a display panel having a front side that displays images, a rear side opposite the front side and side edges extending in a thickness direction of the display from the front side to the rear side; and a bezel arrangement to receive the display panel, the bezel arrangement including a first bezel and a second bezel, each of the first bezel and the second bezel including different materials and including a bottom portion covering the rear side of the display panel and a skirt portion protruding from edges of the bottom portion to cover edges of the side edges of the display panel, wherein at least one opening is arranged in a bottom portion of each of the first bezel and the second bezel.

2. The OLED display device of claim 1, wherein the first bezel and the second bezel comprise a single integrated monolithic unit.

3. The OLED display device of claim 1, wherein the first bezel has a lower surface hardness and a higher elastic modulus than that of the second bezel.

4. The OLED display device of claim 1, wherein the first bezel comprises a resin.

5. The OLED display device of claim 4, wherein the first bezel comprises polycarbonate (PC).

6. The OLED display device of claim 1, wherein the second bezel comprises a metal.

7. The OLED display device of claim 6, wherein the second bezel comprises a material selected from a group consisting of stainless using steel (SUS), steel plate cold commercial (SPCC), aluminum, and a nickel-silver alloy.

8. The OLED display device of claim 1, wherein the first bezel is arranged within the second bezel, the first bezel and second bezel being inseparable from each other, the display panel being arranged within the second bezel.

9. The OLED display device of claim 8, the second bezel being comprised of metal and the first bezel being comprised of resin, the first bezel being produced by an injection molding process.

10. The OLED display device of claim 9, the injection molding process using the second bezel as a mold to produce the first bezel.

11. The OLED display device of claim 1, wherein the at least one opening arranged in a bottom portion of each of the first bezel and the second bezel includes a first opening arranged in the first bezel and a second opening arranged in the second bezel, the second opening being coincident with the first opening.

12. The OLED display device of claim 1, further comprising a plurality of electronic elements arranged within said opening.

13. An organic light emitting diode (OLED) display, comprising:

a display panel;

a flexible printed circuit board; and a bezel arrangement to receive the display panel, the bezel arrangement including a first bezel and a second bezel, the first bezel and the second bezel being comprised of different materials and including a first and a second bottom portion, respectively, and a first and a second skirt portion, respectively, protruding from edges of the respective first and second bottom portions, wherein the first skirt portion of the first bezel and the second skirt portion of the second bezel are each provided with a cut-out to position the flexible printed circuit board thereat, and the second bottom portion of the second bezel is further provided with a cut-out in a side in which a part of the second skirt portion is cut-out forming a groove portion and exposing a part of the first bezel.

14. The OLED display of claim 13, the cut-out in the second bottom portion of the second bezel exposes a part of the first bottom portion of the first bezel.

15. The OLED display of claim 13, the display panel having a front side that displays images, a rear side opposite the front side and side edges extending in a thickness direction of the display from the front side to the rear side, the first and the second bottom portions of the first and the second bezels respectively each cover the rear side of the display panel, the first and the second skirt portions of the first and the second bezels respectively each cover the side edges of the display panel.

16. An organic light emitting diode (OLED) display device, comprising:

a display panel having a front side where images are displayed, a back side opposite to the front side and edges between the front side and the back side;

a printed circuit board (PCB) having a plurality of electronic elements arranged thereon to process a driving signal for the display panel;

a flexible printed circuit (FPC) electrically connecting the PCB to the display panel;

a bezel arrangement to receive the display panel, the bezel arrangement including a first bezel and a second bezel, each of the first bezel and the second bezel including different materials and including a bottom portion and a skirt portion protruding from edges of the bottom portion, the bottom portion of the first bezel covering the back side of the display panel, the skirt portion of the first bezel covering the edges of the display panel, the bottom portion of the first bezel having a first opening and the bottom portion of the second bezel having a second opening that overlaps the first opening, the electronic elements being arranged in the first and second openings.

17. The OLED display device of claim 16, the first and the second openings exposing the back side of the display panel.

18. The OLED display device of claim 16, the first bezel comprising a resin and the second bezel comprising a metal.

19. The OLED display device of claim 16, the first and second openings being spaced apart from the skirt portions and being near a center of the bottom portion of each of the first and second bezels.

20. The OLED display device of claim 16, the first and second openings being coincident with each other and exposing the back side of the display panel.

* * * * *